US006297556B1

(12) United States Patent
Heger et al.

(10) Patent No.: US 6,297,556 B1
(45) Date of Patent: Oct. 2, 2001

(54) ELECTRICALLY RESISTIVE STRUCTURE

(75) Inventors: Anton Heger; Edward W. A. Young, both of Eindhoven (NL)

(73) Assignee: U.S. Philips Corporation, New York, NY (US)

( * ) Notice: Subject to any disclaimer, the term of this patent is extended or adjusted under 35 U.S.C. 154(b) by 0 days.

(21) Appl. No.: 08/814,451

(22) Filed: Mar. 10, 1997

Related U.S. Application Data

(63) Continuation of application No. 08/511,508, filed on Aug. 4, 1995, now abandoned.

(30) Foreign Application Priority Data

Aug. 5, 1994 (EP) ................................................ 94202264

(51) Int. Cl.[7] .......................... H01L 29/00; H01L 23/48; H01L 23/52; H01L 29/40

(52) U.S. Cl. .......................... 257/766; 257/767; 257/536; 257/537

(58) Field of Search .................................... 257/536, 537, 257/379, 380, 381

(56) References Cited

U.S. PATENT DOCUMENTS 3,781,610 * 12/1973 Bodway .............................. 317/101
3,849,757 * 11/1974 Khammous et al. ................ 338/320
3,883,947 * 5/1975 Kruger et al. ......................... 29/620
4,019,168 * 4/1977 Collins ................................ 428/702
4,164,607 * 8/1979 Thiel et al. .......................... 428/621
4,690,728 * 9/1987 Tsang et al. ......................... 338/309
4,742,325 * 5/1988 Muller et al. ........................ 338/308
4,891,977 * 1/1990 Johnson et al. ................... 73/204.26
5,021,867 * 6/1991 Przybysz ............................... 357/71
5,041,191 * 8/1991 Watson ................................ 156/652
5,475,254 * 12/1995 Takahashi ........................... 257/536

FOREIGN PATENT DOCUMENTS

3200983 A1 * 7/1983 (DE) .................................... 338/308
0175654 3/1986 (EP) .

OTHER PUBLICATIONS

S .M. Ojha, "The Depositon of Cermet Films from a Powder Target by R.F. Sputtering", Thin Solid Films, 57(1979)363–366.*

"The Chemistry of the Semiconductor Industry", edited by S.J. Moss & A. Ledwith, ISBN 0–216–92005–1, Blackie & Son, London, 1987, chapters 9, 11. pp. 175–196, 225–281.

* cited by examiner

*Primary Examiner*—Eddie C. Lee
*Assistant Examiner*—Jesse A. Fenty
(74) *Attorney, Agent, or Firm*—Norman N. Spain

(57) ABSTRACT

An electrically resistive structure comprising a substrate (11) which is provided on at least one side with a first resistive film (13) and a second resistive film (17), the materials of these first and second films (13, 17) being mutually different, whereby an anti-diffusion film (15) is disposed between the first and second films (13, 17). The presence of such an anti-diffusion film (15) allows annealing of the resistive structure without significant degradation of its resistive properties. Suitable alloy materials for use in such an anti-diffusion film (15) include WTi, and particularly WTiN. Appropriate exemplary materials for the first resistive film (13) and second resistive film (17) include SiCr and CuNi alloys, respectively.

4 Claims, 1 Drawing Sheet

ELECTRICALLY RESISTIVE STRUCTURE

This is a continuation of application Ser. No. 08/511,508, filed Aug. 4, 1995 now abandoned.

BACKGROUND OF THE INVENTION

The invention relates to an electrically resistive structure comprising a substrate which is provided on at least one side with a first and a second film of resistive material, the materials of the first and second films being mutually different.

An electrically resistive structure of this type is known from European Patent Specification EP-B 0 175 654, wherein an $Al_2O_3$ substrate is consecutively provided with resistive films of cermet and NiCr. Since the sheet resistance of the NiCr film is significantly lower than that of the cermet film, such a structure may be viewed as an in-plane parallel arrangement of a high-ohmic resistor (cermet) and a low-ohmic shunt (NiCr).

When a structure of this type is embodied as a connecting double strip between two terminal points on the substrate, its in-plane electrical resistance between those points can be successively increased by, for example:

- Increasing the path-length of the structure, or decreasing its width;
- Etching away the low-ohmic shunt strip;
- Increasing the path-length of the remaining high-ohmic resistor strip, or decreasing its width.

Such procedures can be controllably performed with the aid of well-known selective masking and etching techniques, such as elucidated for example in the book "The Chemistry of the Semiconductor Industry", edited by S. J. Moss and A. Ledwith, ISBN 0-216-92005-1, Blackie & Son, London (1987), in particular in chapters 9 and 11. In this manner, it is possible to produce a substrate having on its surface well-defined strips of resistive material which demonstrate a variety of accurately trimmed resistances. When provided with external electrical contacts, such strips serve as integrated resistors, so that it is possible to achieve an entire integrated thin film resistor network upon the substrate.

In the interest of maximising the range of possible resistance values which can be achieved on any given specimen substrate, it is advantageous if the sheet resistances of the materials of the first and second films differ by at least one order of magnitude (i.e. factor of ten), and preferably by several orders of magnitude (such as a factor of 1000). In addition, the achievement of well-defined resistance tolerances over a relatively wide temperature range requires the resistive structure to have a stabilised Temperature Coefficient of Resistance (TCR).

For purposes of clarity, the sheet resistance $R_\square$ of a film of thickness t comprising a material of electrical resistivity ρ is here defined as $R_\square=\rho/t$.

The inventors have observed that the TCR of various resistive materials in a single-layer configuration can generally be significantly stabilised by subjecting those materials to an annealing step, typically performed at a temperature of about 350–550° C. in a gaseous atmosphere (comprising, for example, air, nitrogen or argon). In the case of a bilayer resistive structure, however, it has unfortunately been observed that subjection of the structure to such annealing treatment generally causes deterioration of the properties of at least one of the structure's component resistive materials. In particular, the TCR-value of at least one of the materials may change significantly from that which was originally intended. In addition, annealing can lead to a substantial reduction of the difference in sheet resistance between the first and second resistive films, particularly when this difference is originally large (e.g. factor 100–1000).

SUMMARY OF THE INVENTION

It is an object of the invention to provide an electrically resistive structure as described in the opening paragraph, in which structure a sizeable magnitude-difference between the sheet resistances of the first and second resistive films can be achieved and maintained. It is a further object of the invention that the resultant TCR of this structure should be essentially stable and predictable. In particular, it is an object of the invention that these properties should remain well-preserved in the event that the resistive structure is subjected to an annealing treatment as hereabove set forth.

These and other objects are achieved in an electrically resistive structure according to the opening paragraph, characterised in that an anti-diffusion film (i.e. diffusion barrier) is disposed between the first and second resistive films.

The invention rests upon the inventors' observation that, in the known resistive structure, annealing treatment can induce significant material interdiffusion at the interface between the adjacent first and second resistive films. Since these films are typically thin (generally of the order of a few hundred nanometers), the migration of even a small quantity of metal ions from a low-resistance film (e.g. CuNi) into a bordering high-resistance film (e.g. CrSi) can cause a dramatic decrease in the sheet resistance of the latter film, whereby an initially sizeable magnitude-difference between the sheet resistances of the two films is consequently sharply reduced. Such migration effects also tend to significantly alter the TCR of the component films from its desired value. The presence of the inventive diffusion barrier stringently inhibits these unwanted effects.

Use of such an anti-diffusion film according to the invention allows considerable simplification and acceleration of the resistive structure's manufacture. This is because the entire structure can be annealed in one step, once the various films have been deposited in an unbroken deposition cycle. In the absence of the inventive diffusion barrier, any attempt at thermally-induced TCR stabilisation would have to be carried out on a tedious and generally less effective film-by-film basis, whereby the structure would have to be repeatedly annealed after deposition of each individual film.

The anti-diffusion film in accordance with the invention is preferably an electrical conductor, thereby ensuring uniform electrical contact between the lower and upper resistive films. Such electrical contact has the advantage that it allows the lower resistive film to be conveniently contacted via randomly placed electrical terminals on the surface of the upper resistive film.

However, the inventive diffusion barrier need not necessarily comprise electrically conductive material. In such a case, electrical contact with the lower resistive film cannot conveniently be made via the upper resistive film, but must instead be achieved separately, e.g. with the aid of bridging edge contacts, or exposure of part of the lower film by lithographic removal of overlying material.

In addition to its primary ability to hinder diffusion, the material of the diffusion barrier should favourably have a low TCR (less than or of the order of 50 ppm/K), and should preferably be such that it can conveniently be deposited by conventional industrial means such as, for example, sputtering or vapour deposition (physical or chemical).

In the light of such desirable properties, very satisfactory results have been obtained with resistive structures in which the inventive anti-diffusion film comprises a WTi alloy. In particular, a highly effective embodiment of the inventive structure is characterised in that the material of the anti-diffusion film is comprised of a WTiN alloy, and preferably contains at least 95 mol. % $(W_xTi_{1-x})_yN_{1-y}$ wherein both x and y lie in the range 0.7–0.9 (the remaining 5 mol. % of the film being allowed to comprise other substances, present as additives or impurities). Such a WTiN film is electrically conductive, typically has a TCR of less than 30 ppm/K, and can be conveniently deposited by, for example, sputtering a WTi alloy target in an atmosphere containing nitrogen gas. A minimal diffusion barrier thickness of about 100 nm is generally sufficient to ensure its effective performance.

An example of a suitable non-conductive material for use in the inventive anti-diffusion barrier is $SiO_2$.

Appropriate high-ohmic alloy materials for use in the inventive structure include, for example, CrSi, CrSiN and CrSiO, whereas exemplary low-ohmic alloy materials include CuNi, NiCr and NiCrAl. Such materials may be deposited by, for example, co-sputtering from individual single-component targets, or single-target sputtering from alloy targets, whereby an O or N content can be achieved by conducting the deposition in a background gas comprising oxygen or nitrogen, respectively. Alternatively, an oxide or nitrate material may be sputtered in vacuum. A particularly suitable resistive film combination employs high-ohmic $Si_xCr_{1-x}$, $0.7 \leqq x \leqq 0.8$, in conjunction with low-ohmic $Cu_yNi_{1-y}$, $0.6 \leqq y \leqq 0.7$. With this particular combination, the sheet resistance of the high-ohmic film exceeds that of the low-ohmic film by a factor of about 1000.

It is, of course, also possible to embody the inventive resistive structure with more than just two resistive films. In such a multilayer resistive structure, anti-diffusion films should then be provided between all consecutive resistive films.

In addition to the inventive diffusion barrier between the individual resistive films of the resistive structure, it is also desirable to provide diffusion barriers between the resistive films and, for example, any metallic contact layers in connection therewith. Such latter diffusion barriers need not be of the same composition as the inventive barrier interposed between neighbouring resistive films. For example, WTiN can be employed as an anti-diffusion film between a high-ohmic film of CrSi and a low-ohmic film of CuNi, whereas WTi can be used as a diffusion barrier between the same CuNi film and an overlying Au or Al contact layer.

It should be noted that the term "structure" as employed throughout this text is intended to refer to sandwiches and multilayers in general, whether or not such layered compositions have been patterned by masking, etching or other techniques. Similarly, the term "film" can refer both to expansive sheet-like layers and narrow strip-like layers, regardless of further shape or patterning.

BRIEF DESCRIPTION OF THE DRAWING

The invention and its attendant advantages will be further elucidated with the aid of an exemplary embodiment and the accompanying schematic drawings, not of uniform scale, whereby.

EXEMPLARY EMBODIMENT

Figure 1:
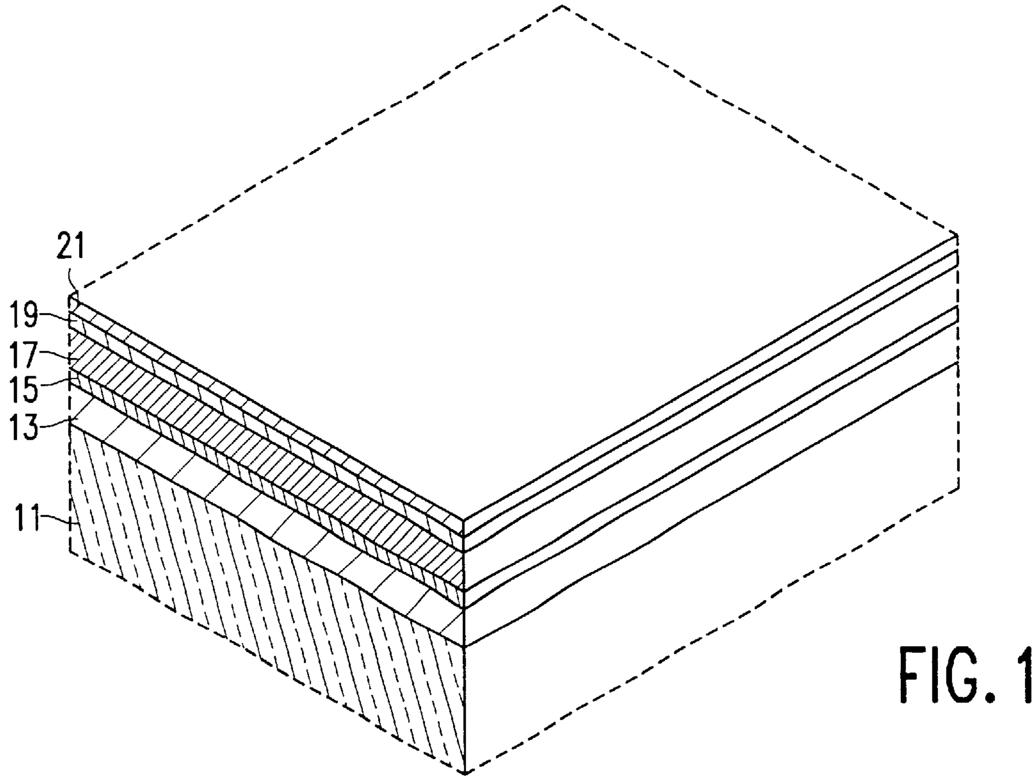
FIG. 1 renders a cross-sectional view of part of a resistive structure in accordance with the invention.
Figure 2:
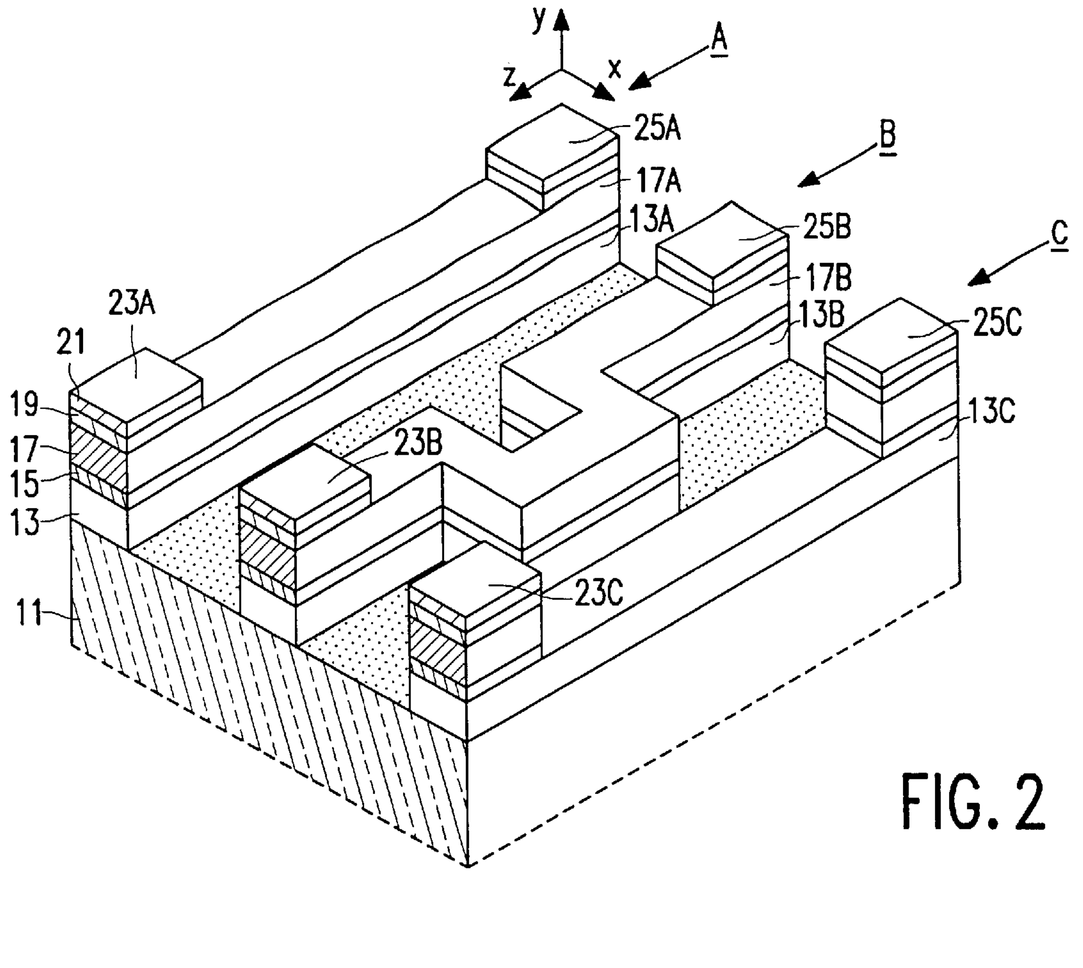
FIG. 2 depicts the subject of FIG. 1 subsequent to the enaction of a number of selective etching steps, resulting in the creation of an exemplary integrated resistor network.

FIGS. 1 and 2 show various stages in the manufacture of a resistive structure in accordance with the present invention. Corresponding features in both Figures are provided with identical reference labels.

FIG. 1 depicts a substrate 11 which has been provided with a first resistive film 13 and a second resistive film 17. The resistive materials of the films 13 and 17 are mutually different, and are thus chosen that the sheet resistance of film 13 greatly exceeds that of film 17 (preferably by a factor of about 1000). In accordance with the invention, an electrically conductive anti-diffusion film (diffusion barrier) 15 is interposed between the films 13 and 17. The structure is further provided with an electrical contact film 21, which is separated from the resistive film 17 by a diffusion barrier 19.

As a specific example, the various components of the depicted resistive structure can be embodied as follows:

Substrate 11: Polished, HF-dipped $Al_2O_3$;

First resistive film 13: $(Si_{75}Cr_{25})_{80}O_{20}$, obtained by RF sputter deposition from a sintered Si-Cr-$SiO_2$ target. After 30 minutes sputtering at a power of 275 W, the thickness of such a film is about 75 nm, and its sheet resistance is approximately 2–3kΩ;

Anti-diffusion film 15: $(W_{80}Ti_{20})_{80}N_{20}$, obtained by reactive sputter deposition from a $W_{70}Ti_{30}$ target in the presence of $N_2$. Such a film has a typical thickness of about 100 nm, and a sheet resistance of approximately 35 Ω;

Second resistive film 17: $Cu_{66}Ni_{34}$, provided by DC sputter deposition. The thickness of such a film is of the order of 2000 nm after 10 minutes sputtering at a power of 750 W, and its sheet resistance is of the order of 2–3 Ω;

Diffusion barrier 19: Sputtered $W_{75}Ti_{25}$, with a thickness of about 150 nm;

Electrical contact film 21: Al, with a thickness of approximately 500 nm.

Subsequent to deposition of the films 13–21, the entire structure is annealed for 15 hours at a temperature of 425° C. After this annealing procedure, the TCR of the structure (particularly of the first resistive film) is observed to be less than 50 ppm/K, and the sheet resistance of film 13 is still found to exceed that of film 17 by a factor of about 1000.

FIG. 2 shows the annealed subject of FIG. 1, subsequent to the performance of a number of illustrative selective masking and etching operations thereupon. For reference purposes, an orthogonal axis system (x,y,z) is defined in the Figure, whereby axes x and z extend parallel to the plane of the substrate 11, and the axis y extends perpendicular to this plane. As is clear from the Figure, parts of the films 13–21 have been locally removed so as to expose bare strips of the substrate 11 in the (x,z) plane, whilst forming isolated multilayer strips A, B and C.

In strip A, films 21 and 19 have been removed, except in two portions 23A, 25A at the extremities of the strip. These portions 23A, 25A serve as electrical contacts for the resistive films interposed therebetween. Since the resistance of film 17A is very much less than that of film 13A (and acts as a shunt thereover), the resistance measured between points 23A and 25A will be relatively low.

Strip B is similar in its film-composition to strip A, but is different in its geometry in that it contains a deliberate in-plane bend, which serves to increase the effective path-length between terminal points 23B and 25B. As a result, the measured electrical resistance between these terminal points will be higher than that observed between points 23A and 25A.

Strip C is similar in its geometry to strip A, but differs in its film-composition, since it consists only of a high-ohmic film 13C (its low-ohmic film 17C having been etched away). The measured resistance between points 23C and 25C will therefore be higher than that between points 23B and 25B, since there is no low-ohmic shunt present between the former points.

Apart from using the measures already referred to hereabove, the resistances of the multilayer strips A, B and C can also be accurately trimmed by appropriate choice of the width of the strips in the x-direction. Needless to say, such resistive strips can take many different geometric forms, and can be disposed in a variety of patterns on the face of the underlying substrate. Assuming an exemplary factor 1000 difference between the sheet resistances of the first and second films, a very wide range of resistance values (1Ω-1MΩ) can be obtained on a single substrate.

What is claimed is:

1. An integrated resistor comprising a substrate which is provided on at least one side with a first and a second film of resistive material, said first film comprising a SiCr alloy and said second film comprising a CuNi alloy and an electrically conductive anti-diffusion film comprising a WTiN alloy disposed between said first and second films of resistive material.

2. An integrated resistor as claimed in claim 1 wherein the anti-diffusion film is electrically conductive.

3. An integrated resistor comprising a substrate which is provided on at least one side with a first and a second film of resistive material, said first film comprising a SiCr alloy and said second film comprising CuNi alloy and an electrically conductive anti-diffusion film comprising a WTi alloy disposed between said first and second films of resistive material.

4. An integrated resistor comprising a substrate which is provided on at least one side with a first and a second film of resistive material, said first film comprising a siCr alloy and said second film comprising a CuNi alloy and an anti-diffusion film of as material having a TCR not greater than in the order of 50 ppm/K disposed between said first and second films of resistive material.

* * * * *